United States Patent
Eynon

(10) Patent No.: US 7,351,503 B2
(45) Date of Patent: Apr. 1, 2008

(54) FUSED SILICA PELLICLE IN INTIMATE CONTACT WITH THE SURFACE OF A PHOTOMASK

(75) Inventor: Ben Eynon, Round Rock, TX (US)

(73) Assignee: Photronics, Inc., Brookfield, CT (US)

( * ) Notice: Subject to any disclaimer, the term of this patent is extended or adjusted under 35 U.S.C. 154(b) by 239 days.

(21) Appl. No.: 10/733,723

(22) Filed: Dec. 11, 2003

(65) Prior Publication Data

US 2004/0121248 A1    Jun. 24, 2004

Related U.S. Application Data

(63) Continuation-in-part of application No. 10/322,858, filed on Dec. 18, 2002, now Pat. No. 6,686,103, which is a continuation of application No. 09/766,907, filed on Jan. 22, 2001, now Pat. No. 6,524,754.

(51) Int. Cl.
    *G03F 1/00*    (2006.01)
    *B32B 3/02*    (2006.01)

(52) U.S. Cl. .............................. 430/5; 428/14

(58) Field of Classification Search .................. 430/5; 428/14
    See application file for complete search history.

(56) References Cited

U.S. PATENT DOCUMENTS

| | | | |
|---|---|---|---|
| 4,269,654 A | 5/1981 | Deckert et al. | |
| 4,482,591 A | 11/1984 | Ward | |
| 4,499,231 A | 2/1985 | Ward et al. | |
| 4,677,042 A | 6/1987 | Kato et al. | |
| 4,889,586 A | 12/1989 | Noguchi et al. | |
| 4,996,106 A | 2/1991 | Nakagawa et al. | |
| 5,159,039 A | 10/1992 | Kolesinski | |
| 5,234,742 A | 8/1993 | Hatano et al. | |
| 5,286,567 A | 2/1994 | Kubota et al. | |
| 5,286,681 A | 2/1994 | Maeda et al. | |
| 5,339,197 A | 8/1994 | Yen | |
| 5,370,951 A | 12/1994 | Kubota et al. | |
| 5,378,514 A | 1/1995 | Hamada et al. | |
| 5,419,972 A | 5/1995 | Kawaguchi et al. | |
| 5,449,742 A | 9/1995 | Beuhler et al. | |
| 5,453,816 A | 9/1995 | Wang | |
| 5,470,621 A | 11/1995 | Kashida et al. | |
| 5,529,819 A | 6/1996 | Campi, Jr. | |
| 5,576,125 A | 11/1996 | Bih | |
| 5,597,669 A * | 1/1997 | Hamada et al. ................. | 430/5 |
| 5,616,927 A | 4/1997 | Kubota et al. | |

(Continued)

FOREIGN PATENT DOCUMENTS

JP    59-040645    3/1984

(Continued)

OTHER PUBLICATIONS

U.S. Appl. No. 60/283,114, filed Apr. 11, 2001, Franklin D. Kalk.

*Primary Examiner*—S. Rosasco
(74) *Attorney, Agent, or Firm*—Amster, Rothstein & Ebenstein LLP

(57) ABSTRACT

A fused silica pellicle for use on photomasks having increased durability and improved transmission uniformity and birefringence properties. The pellicle is to be intimately secured to the patterned surface of a photomask.

25 Claims, 3 Drawing Sheets

U.S. PATENT DOCUMENTS

| | | |
|---|---|---|
| 5,643,654 A | 7/1997 | Fujita et al. |
| 5,656,342 A | 8/1997 | Kashida |
| 5,674,624 A | 10/1997 | Miyazaki et al. |
| 5,691,088 A | 11/1997 | Kubota et al. |
| 5,693,382 A | 12/1997 | Hamada et al. |
| 5,719,976 A | 2/1998 | Henry et al. |
| 5,723,860 A | 3/1998 | Hamada et al. |
| 5,729,325 A | 3/1998 | Kashida |
| 5,741,576 A | 4/1998 | Kuo |
| 5,814,381 A | 9/1998 | Kuo |
| 5,834,143 A | 11/1998 | Matsuoka et al. |
| 5,935,739 A | 8/1999 | Bayer et al. |
| 5,942,760 A | 8/1999 | Thompson et al. |
| 5,976,620 A | 11/1999 | Sanada et al. |
| 5,999,290 A | 12/1999 | Li |
| 6,055,040 A | 4/2000 | Sego |
| 6,197,454 B1 | 3/2001 | Yan |
| 6,639,650 B2 | 10/2003 | Shirasaki |
| 6,720,116 B1 * | 4/2004 | Tzu et al. ............... 430/5 |
| 6,841,312 B1 | 1/2005 | Kalk |
| 6,859,330 B2 * | 2/2005 | Kozlovsky et al. ......... 359/639 |

FOREIGN PATENT DOCUMENTS

| | | |
|---|---|---|
| JP | 62-288842 | 12/1987 |
| JP | S 62-288842 | 12/1987 |
| JP | 63-006553 | 1/1988 |
| JP | S 63-006553 | 1/1988 |
| JP | 04009061 A | 1/1992 |
| JP | 4-124256 | 11/1992 |
| JP | 05232689 A | 9/1993 |
| JP | 06-075364 | 3/1994 |
| JP | 06-125152 | 5/1994 |
| JP | 10-92743 | 4/1998 |
| JP | 10-116886 | 5/1998 |
| JP | 11-194481 | 7/1999 |
| JP | 2000-292908 | 10/2000 |

* cited by examiner

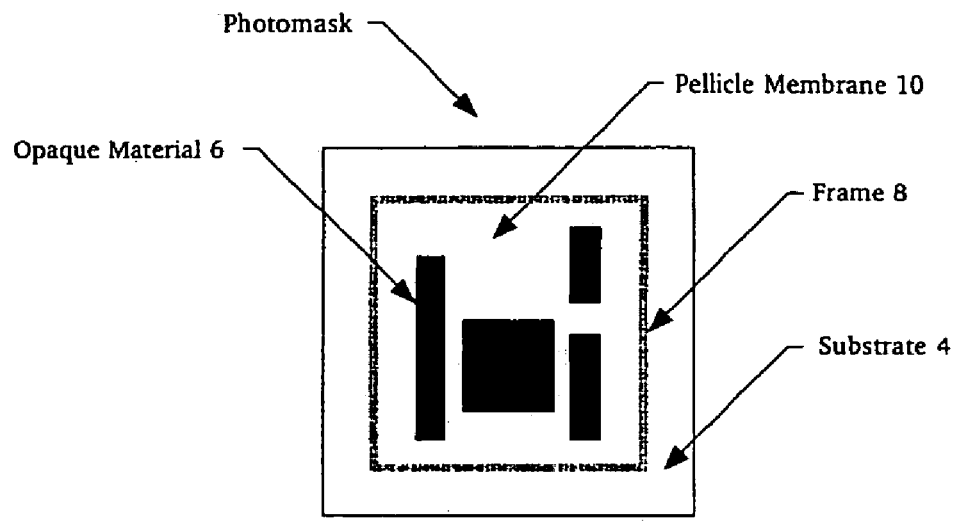
FIG. 1A - TOP VIEW OF PHOTOMASK
(PRIOR ART)
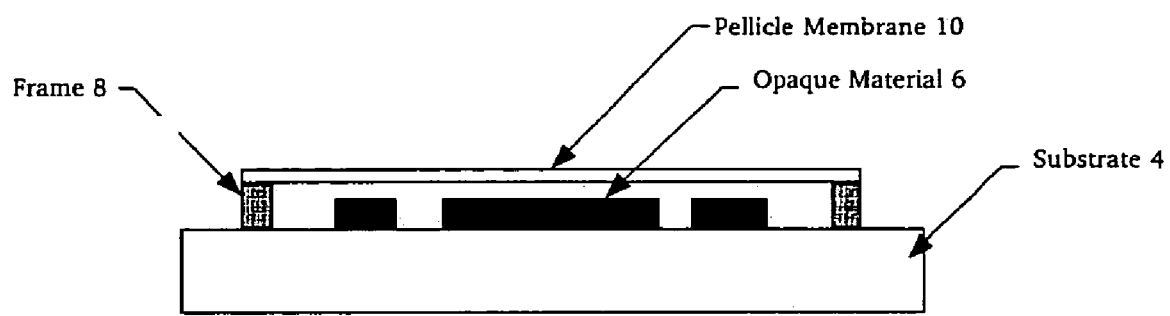
FIG. 1B - CROSS SECTIONAL VIEW OF PHOTOMASK
(PRIOR ART)

FUSED SILICA PELLICLE IN INTIMATE CONTACT WITH THE SURFACE OF A PHOTOMASK

CROSS-REFERENCE TO RELATED APPLICATION

This patent application is a continuation-in-part application of U.S. application Ser. No. 10/322,858, filed Dec. 18, 2002 now U.S. Pat. No. 6,686,103 and entitled "Fused Silica Pellicle", which is a continuation of U.S. application Ser. No. 09/766,907, filed on Jan. 22, 2001, now Pat. No. 6,524,754, the contents of which are incorporated herein by reference in their entirety.

BACKGROUND OF INVENTION

Photomasks, also called masks, are used in many patterning applications. For example, in the semiconductor industry, photomasks are used to transfer micro-scale images defining a semiconductor circuit onto a silicon or gallium arsenide wafer. In general, a photomask is comprised of a transparent substrate to which a masking material layer is affixed and patterned. The pattern of the masking material is a scaled master of the image desired to be formed on the device substrate.

The transfer of the photomask image to the device substrate occurs through a process commonly referred to as photolithography. More specifically, an exposure system is used to interpose the photomask between a device substrate, which is coated with a layer of photosensitive material, and an optical energy source. Energy from the exposure system is inhibited from passing through the areas of the photomask in which the masking material is present. However, energy generated by the exposure system passes through the portions of the substrate of the photomask not covered by the masking material and causes a reaction in the photosensitive material on the device substrate. Through subsequent processing, the image created on the photosensitive material is transferred to the device for subsequent processing.

Since the masking image on the photomask directly correlates to the image created in the device, any foreign substance or contamination on the surface of the mask during the photolithographic process will cause unwanted images of these artifacts to be printed on the device. To reduce or eliminate photomask surface contamination, a thin, transparent membrane or film commonly referred to as a pellicle is stretched across an anodized aluminum frame mounted on the photomask before the photolithographic process is begun.

FIGS. 1A and 1B depict a top and side view of a typical photomask configured for use in the photolithographic process. As shown, photomask 2 (typically six inches by six inches in size and one-quarter inch thick) is comprised of transparent substrate 4 (e.g., fused silica) and the pattern layer of masking material 6 (e.g., chromium) defining the desired image to be created on the device. Pellicle frame 8 extends around the perimeter of the patterned masking material 6 and is affixed to the substrate 4 via a deposition process as well known in the art. Pellicle membrane 10 is stretched over and affixed to the upper surface of frame 8. As shown, the surface of pellicle membrane 10 is generally parallel to the surface of the photomask and covers the entire patterned area of masking material 6. Thus, any contamination which would otherwise land on the photomask instead falls on the pellicle membrane 10 staying out of the exposure system focal plane.

Another type of known photomask to which a pellicles may be attached is commonly referred to as a phase shift photomask. Phase shift photomasks are generally preferred over binary photomasks where the design to be transferred to the device includes smaller, tightly packed feature sizes which are below the resolution requirements of optical equipment being used. Phase shift photomasks are engineered to be 180 degrees out of phase with light transmitted through etched areas on the photomask so that the light transmitted through the openings in the photomask is equal in amplitude.

One type of known phase shift photomask is commonly referred to as an embedded-attenuated phase shift mask ("EAPSM"). EAPSMs (not shown) typically include a substantially transparent material (such as fused silica) and is commonly referred to as a photomask substrate. The next layer is typically an embedded phase shifting material ("PSM layer") such as molybdenum silicide oxynitride (MoSiON), tantalum silicon nitride (TaSiN), titanium silicon nitride (TiSiN) or zirconium silicon oxide (ZrSiO) and other known phase materials. The next layer is typically an opaque material, such as chromium (Cr), which may optionally include an anti-reflective coating such as chromium oxynitride (CrON). The top layer is a photosensitive resist material. As with binary photomasks, the desired pattern of opaque material to be created on the EAPSM is scanned by an electron beam (E-beam) or laser beam in a raster or vector fashion across the blank EAPSM. As the E-beam or laser beam is scanned across the blank EAPSM, the exposure system directs the E-beam or laser beam at addressable locations on the EAPSM. In the case of a positive photosensitive resist material, the areas that are exposed to the E-beam or laser beam become soluble, while the unexposed portions remain insoluble. In the case of a negative photosensitive resist material, the unexposed areas become soluble, while the exposed portions remain insoluble.

Another type of phase shift mask to which a pellicle may be affixed is an alternating aperture phase shift mask ("AAPSM"). Like a binary photomask, an AAPSM is typically comprised of a layer of opaque material and a substantially transparent substrate which is etched on one side of the opaque features, while not etched on the other side (i.e., etching of the transparent substrate occurs in alternating locations in the substantially transparent substrate). More particularly, the AAPSM (not shown) includes a substantially transparent layer (e.g., fused silica) and an opaque layer (e.g., chrome). The opaque layer is etched to form opaque regions and alternating substantially transparent regions. The substantially transparent regions 13 are further etched such that the AAPSM has recesses in the substantially transparent layer. In other words, the AAPSM has substantially transparent regions (which are un-etched) that alternate with etched recesses between each opaque region.

The effect of this structure when placed in an exposure system is to create light intensity of alternating polarity and 180 degree out of phase. This alternating polarity forces energy transmitted from the exposure system to go to zero at opaque regions while maintaining the same transmission of light at the alternating transparent regions and recesses. Since the photoresist layer on the device substrate is insensitive to the phase of the exposed light, the positive and negative exposed regions appear the same, while the zero region in between is clearly delineated. Thus, a sharper contrast between light (e.g., transparent) and dark (e.g., opaque) regions in the resulting photoresist layer of a device is obtained, thereby making it possible to etch a more accurate image onto the device substrate.

Pellicle membranes known in the prior art are made of organic material such as nitrocellulose or other fluorocarbon-based polymers. Non-uniformities in transmission and birefringence caused by pellicle membranes result in pattern fidelity errors which become more prevalent when feature sizes patterned into the device substrate are in the sub-wavelength regime and may ultimately result in diminished device performance or failure.

The prior art pellicle membranes are susceptible to being scratched and torn, and any damage to the thin pellicle membrane requires that the entire pellicle be removed and replaced. Of course, during the time the pellicle membrane is being removed and replaced, the photomask cannot be used for device fabrication. Additionally, the extensive rework procedure required to remove and replace damaged pellicles sometimes results in the ultimate rejection of the entire photomask. Further, as discussed above, the pellicle membrane 10 prevents contaminants from reaching the photomask surface and therefore must be cleaned occasionally. Pellicles are typically cleaned using a nitrogen gun. However, due to their somewhat fragile nature, the prior art pellicle membranes have a propensity to break or otherwise become damaged during the cleaning process requiring their removal and replacement. Also, defects that cannot be removed with a nitrogen gun also cannot be removed mechanically for fear or scratching or tearing the membrane. Here again, during the pellicle replacement process, the photomasks cannot be used for device fabrication and there is a risk of rejection of the entire photomask.

SUMMARY OF INVENTION

Accordingly, it is the object of the present invention to overcome the shortcoming of the prior art by providing a pellicle which is in intimate contact with a substrate on a processed photomask.

BRIEF DESCRIPTION OF DRAWINGS

FIG. 1A is a top-level view of a prior art photomask configured for use in a photolithographic process.

FIG. 1B is a cross-sectional view of a prior art photomask configured for use in a photolithographic process.

It will be appreciated by those skilled in the art that FIGS. 1A through 3 are for illustrative purposes only and therefore are not per scale.

DETAILED DESCRIPTION OF THE INVENTION

Figure 2:
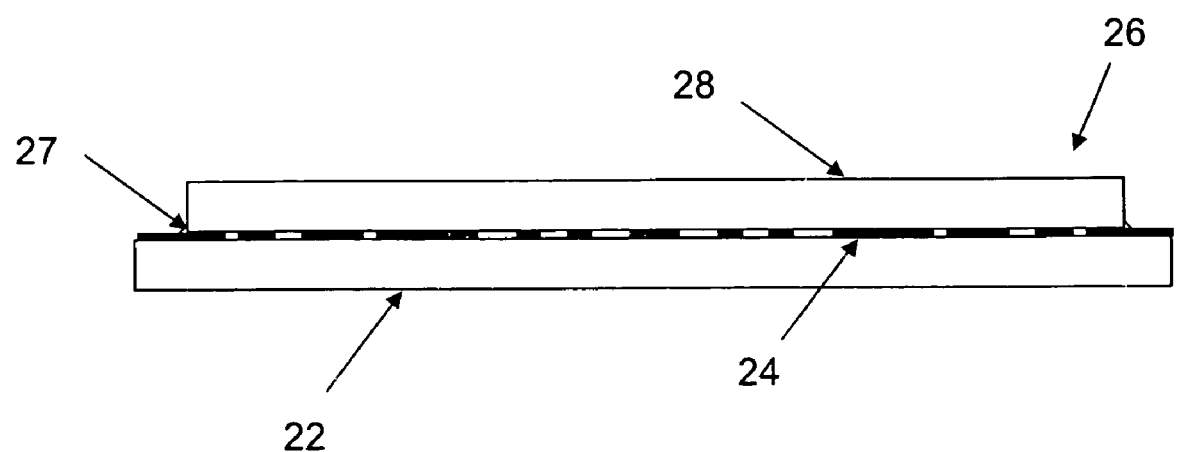
FIG. 2 is a cross-sectional view of a photomask configured in accordance with the present invention for use in a photolithographic process.
Figure 3:
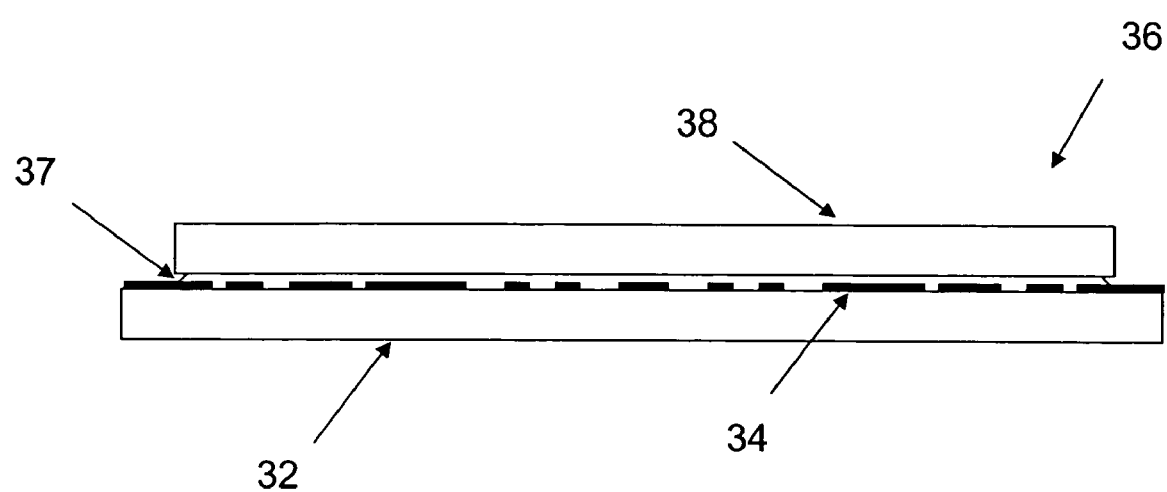
FIG. 3 is a cross-sectional view of a photomask having a planarization layer configured in accordance with the present invention for use in a photolithographic process.

FIG. 2 depicts a photomask configured in accordance with the present invention. As shown, photomask 26 comprises a substantially transparent photomask substrate 22 to which a patterned layer of masking material 24 is affixed. The pattern layer of masking material 24 represents a scaled image of the pattern desired to be created on the device substrate. As discussed above, the photomask substrate may be comprised of fused silica and the masking material may be comprised of chromium. Those skilled in the art will understand that other materials are used to create photomasks, and that the present invention is not limited for use with photomasks having fused silica substrates and chromium masking material. Further, those skilled in the art will understand that the pellicle of the instant invention can be used in conjunction with all types of photomasks including, but not limited to, binary masks (discussed above) and phase shift masks (PSM), e.g., embedded-attenuated phase shift mask ("EAPSM"), alternating aperture phase shift mask ("AAPSM"), etc.

Pellicle 28 is comprised of a flat, polished, low birefringence slice of fused silica dimensioned to generally conform to the dimensions of the exposure tool's mechanical tolerances. One or more of the edges or corners of the fused silica pellicle 28 may be beveled or rounded for safety reasons. The overall thickness of fused silica pellicle 28 may be varied, the only restriction being that the overall thickness of adhesive and pellicle 28 be such that the entire assembly fit in the exposure system. In general, the thicker the fused silica pellicle the more durable it will be.

The fused silica pellicle 28 is mounted such that it is in intimate contact with the mask pattern surface. The membrane thickness can be varied, but must not exceed the specified limits of commercial exposure systems. In this embodiment, the fused silica pellicle needs no frame as it is fixed directly to the mask surface with a fillet bead 27 around the edge. The fused silica pellicle may be affixed using adhesives which are well known in the art which may include, e.g., SAG, acrylics and SEBs. Alternatively to enhance removeability, the fused silica pellicle may to affixed using a reusable adhesive examples of which are known in the art. Additionally, pellicle 28 may be secured by means of a static charge. It is noted that this embodiment can be modified such that the fused silica pellicle 28 is fixed to the phase shift layer of EAPSM or the opaque layer of an AAPSM or some other top surface of a processed photomask.

In another embodiment (FIG. 3), a planarization layer 37 may be placed on the top surface of the photomask 36 prior to the placement of the pellicle 38. The planarazation layer 37 may be comprised of such known materials as silicon dioxide, spin-on glass, or some other organic or inorganic planarization layer as known in the art. Alternatively, the planarization layer 37 may be comprised of an adhesive which can be used to adhere the pellicle.

Various additional modifications and improvements thereon will become readily apparent to those skilled in the art. For example, rather than be comprised of fused silica, the pellicle may be made from F-doped fused silica for 157 nm applications or silicon nitride for EPL and NGL applications. Accordingly, the spirit and scope of the present invention is to be construed broadly and limited only by the appended claims, and not by the foregoing specification.

What is claimed is:

1. A photomask comprising:
   (a) a substantially transparent photomask substrate,
   (b) a patterned area of masking material affixed to said photomask substrate, and
   (c) a fused silica pellicle affixed to said patterned area of masking material.

2. The photomask of claim 1 wherein said silica pellicle is made from F-doped fused silica.

3. The photomask of claim 1 wherein said silica pellicle is made from silicon nitride.

4. The photomask of claim 1 wherein said silica pellicle is affixed to said patterned area of masking material using an adhesive.

5. The photomask of claim 1 wherein said silica pellicle is affixed to said patterned area of masking material using a reusable adhesive.

6. An embedded-attenuated phase shift photomask comprising:
   (a) a substantially transparent photomask substrate;
   (b) a phase shift layer affixed to said photomask substrate;
   (c) a patterned area of masking material affixed to said phase shift layer; and
   (d) a fused silica pellicle affixed to said patterned area of masking material.

7. The embedded-attenuated phase shift photomask of claim 6 wherein said silica pellicle is made from F-doped fused silica.

8. The embedded-attenuated phase shift photomask of claim 6 wherein said silica pellicle is made from silicon nitride.

9. The embedded-attenuated phase shift photomask of claim 6 wherein said silica pellicle is affixed to said patterned area of masking material using an adhesive.

10. The embedded-attenuated phase shift photomask of claim 6 wherein said silica pellicle is affixed to said patterned area of masking material using a reusable adhesive.

11. An alternating aperture phase shift mask comprising:
    (a) a patterned area of a substantially transparent photomask substrate,
    (b) a patterned area of masking material affixed to said photomask substrate, wherein said patterned area of said substantially transparent photomask substrate alternates with said patterned area of said masking material, and
    (c) a fused silica pellicle affixed to said patterned area of masking material.

12. The alternating aperture phase shift mask of claim 11 wherein said silica pellicle is made from F-doped fused silica.

13. The alternating aperture phase shift mask of claim 11 wherein said silica pellicle is made from silicon nitride.

14. The alternating aperture phase shift mask of claim 11 wherein said silica pellicle is affixed to said patterned area of masking material using an adhesive.

15. The alternating aperture phase shift mask of claim 11 wherein said silica pellicle is affixed to said said patterned area of masking material using a reusable adhesive.

16. A photomask comprising:
    (a) a substantially transparent photomask substrate,
    (b) a patterned area of masking material affixed to said photomask substrate,
    (c) a planarization layer affixed to the top surface of said patterned area of masking material, and
    (d) a fused silica pellicle affixed to said planarization layer.

17. The photomask of claim 16 wherein said silica pellicle is made from F-doped fused silica.

18. The photomask of claim 16 wherein said silica pellicle is made from silicon nitride.

19. The photomask of claim 16 wherein said silica pellicle is affixed to said planarization layer using an adhesive.

20. The photomask of claim 16 wherein said planarization layer is an adhesive.

21. The photomask of claim 16 wherein said planarization layer is comprised of silicon dioxide.

22. The photomask of claim 16 wherein said planarization layer is comprised of spin-on glass.

23. The photomask of claim 16 wherein said planarization layer is comprised of an organic material.

24. The photomask of claim 16 wherein said planarization layer is comprised of an inorganic material.

25. The photomask of claim 16 wherein said silica pellicle is affixed to said planarization layer using a reusable adhesive.

* * * * *